(12) United States Patent
Wickersham

(10) Patent No.: US 9,748,910 B1
(45) Date of Patent: Aug. 29, 2017

(54) INSTRUMENT INTERCONNECT SYSTEM

(71) Applicant: Ronald J. Wickersham, Santa Rosa, CA (US)

(72) Inventor: Ronald J. Wickersham, Santa Rosa, CA (US)

(73) Assignee: Ronald J. Wickersham, Santa Rosa, CA (US)

( * ) Notice: Subject to any disclaimer, the term of this patent is extended or adjusted under 35 U.S.C. 154(b) by 0 days.

(21) Appl. No.: 15/414,418

(22) Filed: Jan. 24, 2017

(51) Int. Cl.
| | |
|---|---|
| *H03G 1/00* | (2006.01) |
| *H03G 5/02* | (2006.01) |
| *G10H 1/34* | (2006.01) |
| *G10H 3/18* | (2006.01) |
| *G10H 1/46* | (2006.01) |
| *H04R 3/04* | (2006.01) |

(52) U.S. Cl.
CPC ........... *H03G 1/0035* (2013.01); *G10H 1/348* (2013.01); *G10H 1/46* (2013.01); *G10H 3/186* (2013.01); *H03G 5/025* (2013.01); *H04R 3/04* (2013.01)

(58) Field of Classification Search
CPC ................ A61G 7/012; A61G 2203/36; A61G 2203/34; A61G 2203/44; A61G 2203/726
See application file for complete search history.

(56) References Cited

U.S. PATENT DOCUMENTS 5,585,767 A    12/1996   Wright, Jr.

OTHER PUBLICATIONS

Tillman, Donald J., FET Preamp Cable,Webpage, Jun. 28, 2005.

*Primary Examiner* — Mohammad Islam
(74) *Attorney, Agent, or Firm* — Hoyt A. Fleming, III; Park, Vaughan, Fleming & Dowler LLP

(57) ABSTRACT

An instrument interconnect system that interfaces an instrument, such as a guitar or a bass, to an audio-receiving device, such as an amplifier, effect box, or a mixer. The instrument interconnect system provides enhanced clarity and sonic detail. The instrument interconnect system may allow a musician to select a voltage-buffered output signal, an unbuffered output signal, or may allow a musician to mix a voltage-buffered output signal and an unbuffered output signal. The instrument interconnect system may further allow the musician to selectively activate or deactivate gain-adjustment circuits and equalization circuits.

20 Claims, 7 Drawing Sheets

INSTRUMENT INTERCONNECT SYSTEM

FIELD OF THE INVENTION

This invention relates to an instrument interconnect system that interfaces an instrument, such as a guitar or a bass, to an audio-receiving device, such as an amplifier, effect box, or a mixer. The instrument interconnect system provides enhanced clarity and sonic detail. The instrument interconnect system may allow a musician to select a voltage-buffered output signal, an unbuffered output signal, or may allow a musician to mix a voltage-buffered output signal and an unbuffered output signal. The instrument interconnect system may further allow the musician to selectively activate or deactivate gain-adjustment circuits and equalization circuits.

BACKGROUND OF THE INVENTION

Instruments, such as guitars and basses, have utilized passive pickups for over 60 years. Vintage guitars, such as the Fender Stratocaster™ guitar, Fender Telecaster™ guitar, and the Gibson Les Paul™ guitar, utilize passive pickups. Musicians, such as Jeff Beck, Eddie Van Halen, and Jimi Hendrix, utilized passive pickups to create a "classic" guitar sound that is well known to musicians as well as to the general public. Passive pickups are simple transducers built by wrapping many coils of copper wire around a permanent magnet, which is usually constructed of Alnico or ceramic. Pickups have a significant inductive component that results in the output impedance increasing with frequency. The location of the magnet in close proximity to the strings causes the strings to magnetize. Because of this, when the strings move, they disturb the magnetic field, and cause an electrical current to pass through the copper wire.

Today, many musicians prefer guitars with passive electronics and pickup systems. Passive electronics and pickup systems have a very high dynamic range. Thus, a musician can play a low amplitude whisper quiet part followed by a high amplitude part. Passive electronics and pickup systems tend to lose high-frequency detail and emphasize lower frequencies because the impedance varies with frequency. Thus, guitars with passive electronics and pickup systems produce a warm tone that is highly desired by many musicians. However, the frequency response rolls off even more when the instrument's volume control is set at less than maximum, thus most musicians are forced to never use the volume control except as an "effect" and generally leave the volume at maximum.

Some more recent instruments, such as the Alembic Series II guitar, utilize active electronics and pickup systems instead of passive electronics and pickup systems. An active electronics and pickup system is powered by an electrical power source, such as one or more batteries or an external power supply. Active electronics and pickup systems use coils of wire that are wrapped around a magnet, just like pickups in passive electronics and pickup systems. However, because voltage amplification is provided by the active circuit, the pickups typically use fewer turns on the coil.

The pickups in an active electronics and pickup system are typically coupled to a preamplifier that is built into the guitar. Thus, the output signal impedance of guitars with active electronics and pickup systems is constant with respect to frequency and is much lower than passive electronics and pickup systems. As a result, such guitars have enhanced clarity and sonic detail, when compared with guitars that utilize passive electronics and pickup systems.

Thus, today many musicians prefer guitars with active pickups because such pickups enable sounds that have a tight and focused clarity, and permit the instrument volume control to be set at less than maximum for the desired output level without compromising the frequency response.

As discussed above, the impedance of the output signal of guitars with passive electronics and pickup systems varies with respect to frequency. In addition, the response of the output signal of such guitars can be degraded by interfacing the guitar to a guitar amplifier, an effect box (also known as a pedal and as a stomp box), or a mixer. In particular, the load capacitance of a guitar cord, which interfaces the guitar to an audio-receiving device, such as a guitar amplifier, an effect box, or a mixer, as well as the load of the audio-receiving device, can degrade the high frequency response of the guitar.

Alembic, Inc. ("Alembic") has long known of the effect of guitar cable load capacitance on the response of guitars with passive electronics and pickup systems. As a result, beginning in 1971, Alembic designed and marketed a "Blaster" aftermarket preamplifier for installation inside an existing guitar equipped with a passive electronics and pickup system. Later, Alembic, Inc. designed and marketed a "Super Cord Active Cable". A schematic diagram of the Alembic Super Cord Active Cable is shown in FIG. 1.

As shown in FIG. 1, the Super Cord Active Cable included an instrument plug. The instrument plug included a conventional first ¼ inch diameter plug with a tip, a sleeve, a tip terminal, a sleeve terminal, and a housing. The instrument plug was intended to be inserted into the well-known conventional ¼ inch jack of guitars with passive electronics and pickup systems. The instrument plug's tip received the output signal from the guitar. Similarly, the instrument plug's sleeve was coupled to the guitar's ground.

The instrument plug of FIG. 1 also housed a preamplifier circuit. The preamplifier circuit included two resistors and a N-channel field effect transistor ("FET"). As shown in FIG. 1, the gate of the FET was coupled to the tip terminal and to the first terminal of a 1 MΩ, resistor, the second terminal of which was coupled to ground. The source of the N-channel FET was coupled to the first terminal of a 13 kΩ resistor, the second terminal of which was coupled to ground. The tip terminal, the sleeve terminal, the 1 MΩ resistor, the 13 kΩ resistor, and the N-channel FET were all located within the conventional housing (not shown) of the first ¼ inch diameter plug. An example of such a conventional housing is shown as item number 30 of FIG. 3 of U.S. Pat. No. 5,585,767 to Wright.

As shown in FIG. 1, the Super Cord Active Cable also included a first cable that included two conductors. The length of the first cable was approximately 19 feet. The first end of the first cable was coupled to the instrument plug. Specifically, the first conductor of the first cable was coupled to the drain of the instrument plug's N-channel FET. The second conductor of the first cable was coupled to the instrument plug's ground. The second end of the first cable was coupled to a battery box.

As shown in FIG. 1, the battery box included a 9-volt battery that included a positive terminal and a negative terminal. The positive terminal of the 9-volt battery was coupled to the first terminal of a 22 kΩ resistor, the second terminal of which was coupled to the first conductor of the first cable. The negative terminal of the 9-volt battery was coupled to the second conductor of the first cable.

As shown in FIG. 1, the Super Cord Active Cable also included a second cable with two conductors. The first end of the second cable was coupled to the battery box. Specifically, first conductor of the second cable was coupled to the battery box's 22 kΩ resistor as shown in FIG. 1. The second conductor of the second cable was coupled to the negative terminal of the battery box's 9-volt battery.

While FIG. 1 shows that the length of the first and second cables are the same, the length of the first cable was approximately 19 feet and the length of the second cable was approximately 1 foot. These cables were flexible and allowed the musician to move freely with respect to an audio-receiving device, such as the musician's amplifier, effect box, or mixer.

As shown in FIG. 1, the second cable was coupled to an amplifier plug. The amplifier plug included a 1 μF capacitor, a 174 kΩ resistor, and a conventional second ¼ inch diameter plug with a tip, a sleeve, a tip terminal, a sleeve terminal, and a housing. The first terminal of the 1 μF capacitor was coupled to the first conductor of the second cable. As shown in FIG. 1, the second terminal of the 1 μF capacitor was coupled to both first terminal of the 174 kΩ resistor and to the tip terminal of the second ¼ inch diameter plug. The second conductor of the second cable was coupled to the second terminal of the 174 kΩ resistor as well as to ground. Finally, the sleeve terminal of the second ¼ inch diameter plug was coupled to ground. The 1 μF capacitor and the 174 kΩ resistor were located within the conventional housing (not shown) of the second conventional ¼ inch diameter plug. The amplifier plug was intended to be coupled to an amplifier, an effect box, or a mixer.

As is evident from FIG. 1, the Super Cord Active Cable of FIG. 1 included a voltage amplifier that transferred a voltage from an instrument, having a high output impedance level, to a flexible cable with a lower output impedance level. Thus, the Super Cord Active Cable voltage-buffered the output signal of an instrument's passive pickups from the capacitive load of the first cable and the second cable, as well as the loading of an audio-receiving device, such as an amplifier, effect box, or mixer. As a result, vintage guitars with passive electronics and pickup systems that were interfaced with amplifiers, effect boxes, or mixers, via the Super Cord Active Cable had enhanced clarity and sonic detail when compared to interfacing the guitars to such devices via conventional guitar cords.

While the Super Cord Active Cable provided enhanced clarity and sonic detail to vintage guitars, the Super Cord Active Cable limited the ability of musicians to authentically reproduce certain classic sounds. Thus, a need exists for an interconnect system that provides the enhanced clarity and sonic detail of the Super Cord Active Cable and that enables musicians to authentically reproduce classic sounds for which vintage instruments were well known.

While the gain of the Super Cord Active Cable is optimal for certain instruments, it is not optimal for some instruments. Thus, a need exists for an interconnect system that enables a musician to have access to the enhanced clarity and sonic detail of the Super Cord Active Cable and that provides the musician with the ability to set the gain of the interconnect system's preamplifier.

As discussed above, the Super Cord Active Cable provided a significant increase in clarity and sonic detail. However, in some circumstances the frequency response of the Super Cord Active Cable is not optimal. Thus, a need exists for an interconnect system that enables a musician to have access to the enhanced clarity and sonic detail of the Super Cord Active Cable and that provides the musician with the ability to modify the frequency response of the interconnect system's output signal.

DETAILED DESCRIPTION OF THE INVENTION

Interconnect System with Selectable Low or High Impedance Output Signal

Figure 1:
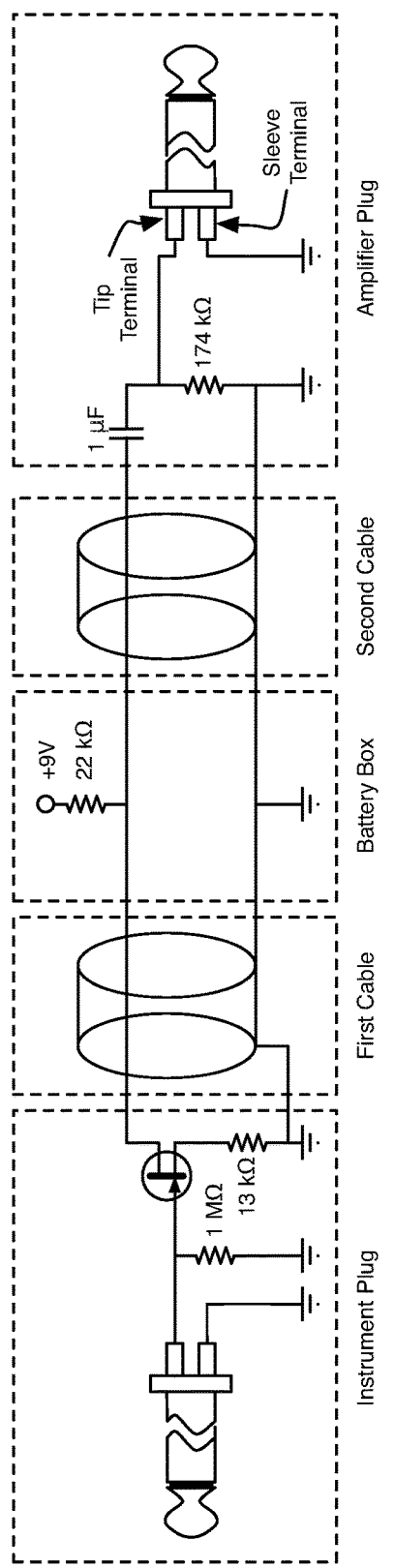
FIG. 1 is a diagram of a prior art Super Cord Active Cable designed and marketed by Alembic, Inc.
Figure 2:
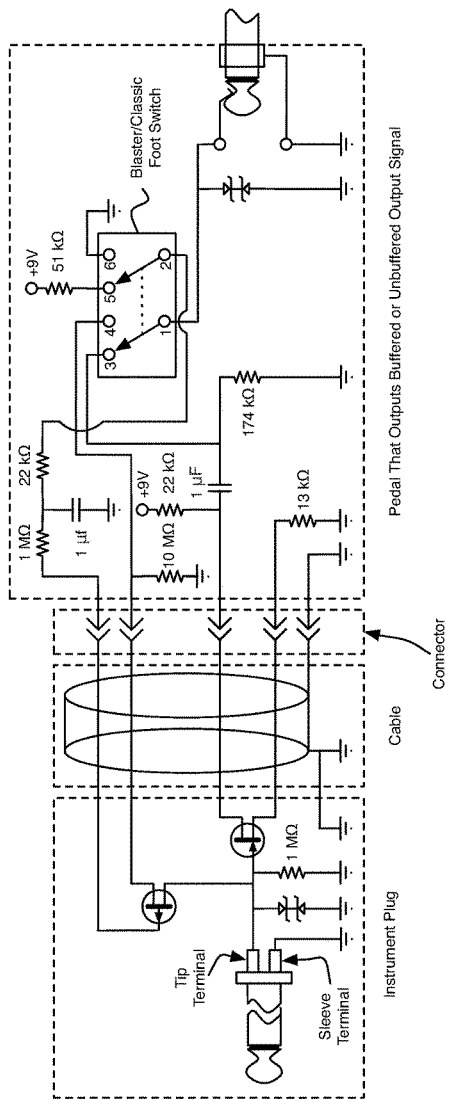
FIG. 2 is a diagram of an instrument interconnect system that allows a musician to select whether the system generates a voltage-buffered output signal or an unbuffered output signal.

One embodiment of the invention is the interconnect system shown in FIG. 2.

As shown in FIG. 2, the interconnect system includes an instrument plug. The instrument plug includes a conventional ¼ inch diameter plug with a tip, a sleeve, a tip terminal, a sleeve terminal, and a housing. The instrument plug is intended to be inserted into the well-known conventional ¼ inch jack of an instrument, such as a guitar or a bass. The instrument plug's tip receives the output signal from the instrument. Similarly, the instrument plug's sleeve is coupled to the instrument's ground.

The instrument plug of FIG. 2 includes a first voltage suppressor, such as the transient voltage suppressor manufactured by On Semiconductor having part number SED5B. The first terminal of the first voltage suppressor is coupled to the tip terminal. The second terminal of the first voltage suppressor is coupled to ground. The purpose of the first voltage suppressor is to protect the preamplifier circuit from damage due to static electricity that may be present near the instrument.

The instrument plug of FIG. 2 also includes a preamplifier circuit. The preamplifier circuit includes a 1 MΩ resistor and a N-channel FET. As shown in FIG. 2, the gate of the N-channel FET is coupled to the tip terminal, the first terminal of the first voltage suppressor, and the first terminal of the 1 MΩ resistor. The second terminal of the 1 MΩ resistor is coupled to ground. The tip terminal, the sleeve terminal, the first voltage suppressor, the 1 MΩ resistor, and the N-channel FET are all located within the conventional housing (not shown) of the ¼ inch diameter plug.

The instrument plug of FIG. 2 also includes a P-channel FET. The drain of the P-channel FET is coupled to the tip terminal, the first terminal of the first voltage suppressor, the first terminal of the 1 MΩ resistor, and the gate of the N-channel FET. The P-channel FET is located within the conventional housing (not shown) of the ¼ inch diameter plug.

As shown in FIG. 2, the interconnect system also includes a cable. The cable, which is flexible and has a length of approximately 25 feet, includes four signal conductors as well as a ground shield. The first conductor of the cable is coupled to the instrument plug's P-channel FET gate. The second conductor of the cable is coupled to the instrument plug's P-channel FET source. The third conductor of the cable is coupled to the instrument plug's N-channel FET drain. The fourth conductor of the cable is coupled to the instrument plug's N-channel FET source. The ground shield of the cable is connected to ground.

As shown in FIG. 2, the interconnect system also includes a five-conductor connector, such as a five-pin XLR connector. The first four conductors of the connector are coupled to the first four conductors of the cable, respectively. The fifth conductor of the connector is coupled to the ground shield of the cable.

As shown in FIG. 2, the interconnect system also includes a pedal. The pedal may be a foot pedal that can be operated by a musician while the musician is playing an instrument. The pedal allows the musician to select whether the instrument interconnect system outputs either a voltage-buffered output signal or an unbuffered output signal. If the musician selects a voltage-buffered output signal, then the output signal of an instrument's pickups is buffered from the capacitive load of the cable as well as the loading of downstream audio-receiving devices, such as an amplifier, an effect box, or a mixer. Thus, the interconnect system will generate an output signal with enhanced clarity and sonic detail. On the other hand, if the musician selects an unbuffered output signal, then the output signal of an instrument's pickups is not isolated from the capacitive load of the cable as well as the loading of downstream devices. Thus, the interconnect will generate an output signal that authentically reproduces classic sounds for which vintage instruments are well known.

As shown in FIG. 2, the pedal is coupled to the five-conductor connector. The first conductor of the connector is coupled to the first terminal of a second 1 MΩ resistor. The second terminal of the second 1 MΩ resistor is coupled to the first terminal of a first 1 µF capacitor. The second terminal of the first 1 µF capacitor is coupled to ground. The first terminal of the first 1 µF capacitor is also coupled to the first terminal of a first 22 kΩ resistor. The second terminal of the first 22 kΩ resistor is coupled to the second terminal of a double-pole double-throw (DPDT) foot switch. As shown in FIG. 2, the second conductor of the connector is coupled to the first terminal of a 10 MΩ resistor. The second terminal of the 10 MΩ resistor is coupled to ground. The first terminal of the 10 MΩ resistor is also coupled to the fourth terminal of the DPDT foot switch.

As shown in FIG. 2, the third conductor of the connector is coupled to the second terminal of a second 22 kΩ resistor. The first terminal of the second 22 kΩ resistor is coupled to a 9-volt power supply, such as a 9-volt battery, the output of an AC to DC converter, or an external power supply. The second terminal of the second 22 kΩ resistor is also coupled to the first terminal of a second 1 µF capacitor. The second terminal of the second 1 µF capacitor is coupled to the third terminal of the DPDT foot switch as well as to the first terminal of a 174 kΩ resistor. The second terminal of the 174 kΩ resistor is coupled to the second terminal of a second voltage suppressor and also to ground. The first terminal of the second voltage suppressor is coupled to the first terminal of the DPDT foot switch. The purpose of the second voltage suppressor is to protect the preamplifier circuit from static electricity that is present near the pedal. The first terminal of the second voltage suppressor is also coupled to the tip terminal of a conventional ¼ inch output jack. The sleeve terminal of the output jack is coupled to ground. The fourth conductor of the connector is coupled to the first terminal of a 13 kΩ resistor. The second terminal of the 13 kΩ resistor is coupled to ground.

The fifth conductor of the connector is coupled to ground.

The fifth terminal of the DPDT foot switch is coupled to the second terminal of a 51 kΩ resistor. The first terminal of the 51 kΩ resistor is coupled to the 9-volt power supply. Finally, the sixth terminal of the DPDT foot switch is coupled to ground.

When the DPDT foot switch is in its first position, the switch's first and third terminals are coupled together as are the switch's second and fifth terminals. Thus, when the DPDT foot switch is in its first position, the interconnect system generates a voltage-buffered output signal. The voltage-buffered output signal will sometimes be referred to as a "Blaster" signal.

On the other hand, when the DPDT foot switch is in its second position, the switch's first and fourth terminals are coupled together as are the switch's second and sixth terminals. Thus, when the DPDT foot switch is in its second position, the interconnect system generates an unbuffered output signal. The unbuffered output signal will sometimes be referred to as a "classic" signal.

In the embodiment shown in FIG. 2, the 13 kΩ resistor is included in the pedal. In other embodiments (not shown), the 13 kΩ resistor could be placed inside of the instrument plug. Placing the 13 kΩ resistor inside the instrument plug has the advantage of eliminating the fourth conductor in the flexible cable as well as the fourth conductor of the connector.

First Interconnect System with Internal Mixer

Figure 3:
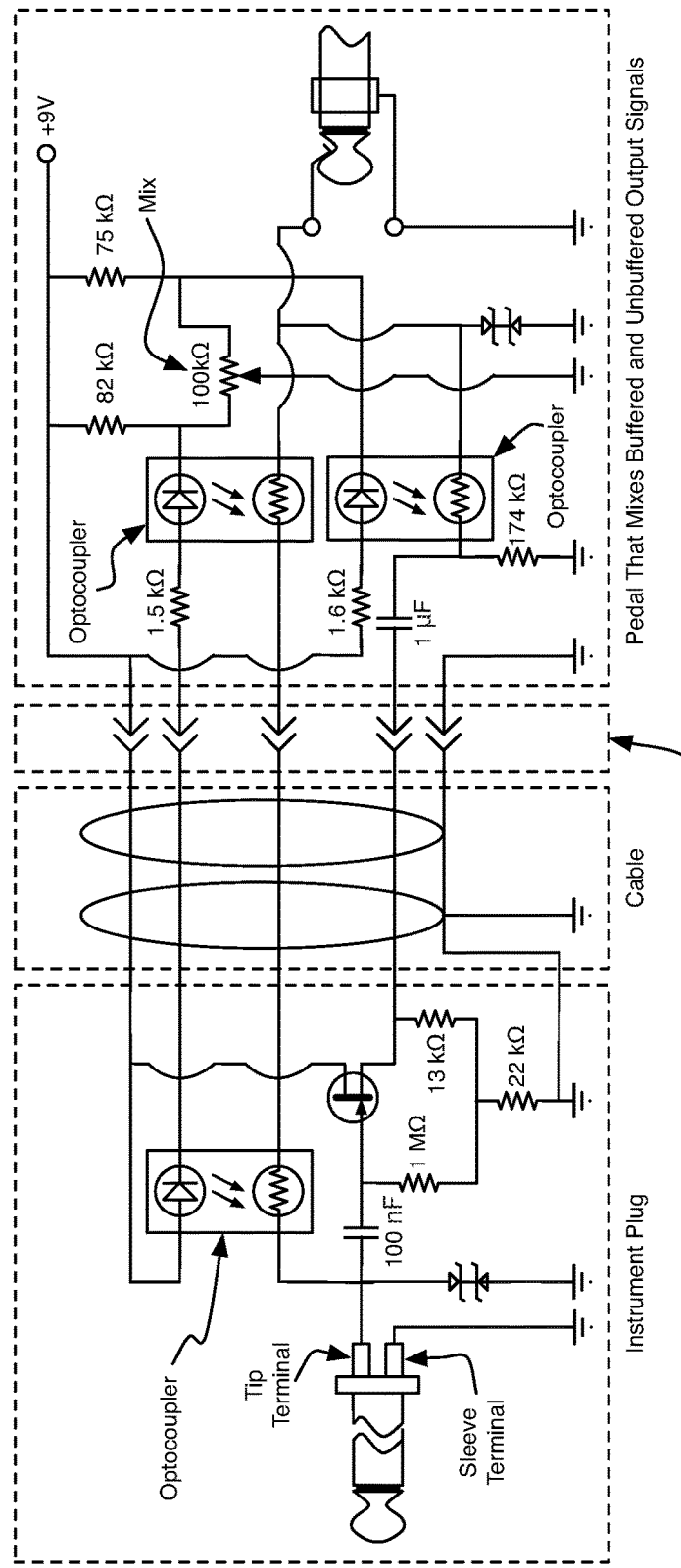
FIG. 3 is a diagram of a first instrument interconnect system that allows a musician to mix a voltage-buffered output signal and an unbuffered output signal.

Another embodiment of the invention is the interconnect system shown in FIG. 3. This interconnect system enables a musician to mix a voltage-buffered signal with unbuffered signal. Thus, the musician can mix classic guitar sounds with sounds that have a tight and focused clarity. For example, the musician could control the percentage of classic and Blaster signals with a remotely located mixer control, such as a foot pedal or a knob.

As shown in FIG. 3, the interconnect system includes an instrument plug, a cable, a connector and a device, such as a pedal.

The instrument plug of FIG. 3 includes a ¼ inch plug with a tip terminal and a sleeve terminal. The ¼ inch plug is coupled to a first optocoupler, such as the NSL 32SR2 optocoupler manufactured by Luna Optoelectronics.

An optocoupler is a device that includes a light source, such as a LED, that is optically coupled to a photocell. The photocell resistance changes based upon the amount of light output by the light source. For example, the resistance of the photocell can be high when the light source is "off" or can be low when the light source is "on". By adjusting the amount of light generated by the light source, the resistance of the photocell can be less than 120Ω or higher than 1 MΩ.

As shown in FIG. 3, the tip terminal is coupled to the first terminal of the first optocoupler's photocell. The tip terminal is also coupled to the first terminal of a first voltage suppressor. The second terminal of the first voltage suppressor is coupled to ground. The tip terminal is also coupled to the first terminal of a 100 nF capacitor. The second terminal of the 100 nF capacitor is coupled to the gate of an N-channel FET and to the first terminal of a 1 MΩ resistor.

The second terminal of the 1 MΩ resistor is coupled to the first terminal of a 22 kΩ and to the second terminal of a 13 kΩ resistor. The second terminal of the 22 kΩ resistor is coupled to ground. The first terminal of the 13 kΩ resistor is coupled to the source of the N-channel FET.

The positive terminal of the first optocoupler's light source is also coupled to the first conductor of the interconnect's cable. The negative terminal of the first optocoupler's light source is coupled to the second conductor of the interconnect system's cable. The second terminal of the first optocoupler's photocell is coupled to the third conductor of the interconnect system's cable. The fourth conductor of the interconnect system's cable is coupled to the source of the N-channel FET and the first terminal of the 13 kΩ resistor. The fifth conductor of the interconnect system's cable is a shield that is coupled to ground.

The 5 conductors of the interconnect system's cable are coupled to a device, such as a pedal, via a 5-conductor connector, such as a 5-pin XLR connector.

As shown in FIG. 3, the interconnect system includes a device, such as a pedal. This device enables a user to mix low impedance and high impedance output signals from an instrument to generate a desired sound.

As shown in FIG. 3, the first terminal of the connector is coupled to a 9-volt power source. The 9-volt power source could be a battery or the output of an (internal or external) AC to DC converter. The 9-volt power source is also coupled to the first terminal of an 82 kΩ resistor, the first terminal of a 75 kΩ resistor, and the first terminal of a 1.6 kΩ resistor. The first terminal provides power for the circuitry in the instrument plug.

The second terminal of the connector is coupled to the first terminal of a 1.5 kΩ resistor. As will be discussed below, the signal on the second terminal of the connector is a control signal that sets the output level of the first optocoupler's light source.

The third terminal of the connector is coupled to the first terminal of a second optocoupler's photocell. As will be discussed below, the signal on the third terminal of the connector is an unbuffered signal, which may be isolated from the tip terminal of the ¼ inch plug jack and the tip terminal of the ¼ inch output jack. Such isolation is optimal when a user desires that the output signal provided to the audio-receiving device is based only upon a voltage-buffered signal.

The fourth terminal of the connector is coupled to the first terminal of a 1 µF capacitor. The signal on the fourth terminal of the connector is a voltage-buffered signal.

The fifth terminal of the connector is coupled to ground.

As shown in FIG. 3, the second terminal of the 1.5 kΩ resistor is coupled to the positive terminal of the second optocoupler's light source. The negative terminal of that light source is coupled to the second terminal of the 82 kΩ resistor and the first terminal of a 100 kΩ variable resistor. The second terminal (wiper) of the 100 kΩ variable resistor is coupled to ground. The third terminal of the 100 kΩ variable resistor is coupled to the second terminal of the 75 kΩ resistor.

As shown in FIG. 3, the second terminal of the second optocoupler's photocell is coupled to the tip terminal of a conventional ¼ inch output jack and the first terminal of a second voltage suppressor. The second terminal of the second voltage suppressor is coupled to ground. The sleeve terminal of the output jack is coupled to ground.

The second terminal of the 1 µF capacitor is coupled to the first terminal of a third optocoupler's photocell and to the first terminal of a 174 kΩ resistor. The second terminal of the third optocoupler's photocell is coupled to the second terminal of the second optocoupler's photocell, the tip terminal of the jack, and the first terminal of the second voltage suppressor. The second terminal of the 174 kΩ resistor is coupled to ground.

The N-channel FET in the above-described embodiment is configured as a source-follower (common drain) non-inverting circuit with a voltage gain approaching unity. Thus, a user can mix a voltage-buffered signal and an unbuffered signal with minimal apparent change in signal level.

As is shown in FIG. 3, the first optocoupler's photocell is controlled via the 100 kΩ variable resistor. The first optocoupler is utilized to isolate the unbuffered signal when a buffered signal is desired. More specifically, by setting the 100 kΩ variable resistor to a value that connects the wiper of the 100 kΩ variable resistor to the second terminal of the 82 kΩ resistor, the light output of the first and second optocouplers' light sources is maximized. Maximizing the light outputs will minimize the resistance of the first and second optocouplers' photocells and will result in the connecting of the unbuffered signal to the ¼ inch diameter jack. Such a connection will cause the interconnect system cable's capacitance to load the unbuffered signal. On the other hand, setting the 100 kΩ variable resistor to a value connects the wiper of the 100 kΩ variable resistor to the second terminal of the 75 kΩ resistor will minimize the light output of the first and second optocouplers' light source. Minimizing the light source will maximize the resistance of the first optocoupler's photocell and will result in the isolation of the instrument signal from the loading (and negative effects described earlier) of the cable capacitance. Thus, a pure buffered signal, can be provided to the tip terminal of the ¼ inch diameter jack. By setting the 100 kΩ variable resistor to an intermediate value, a mixture of an unbuffered signal and a voltage-buffered signal can be provided to the ¼ inch diameter jack.

As shown in FIG. 3, the second and third optocouplers are in series with the unbuffered signal and the voltage-buffered signal. More specifically, the second terminals of the second and third optocoupler's photocells are coupled to the tip terminal of the of the ¼ inch diameter jack. The circuit shown in FIG. 3 illuminates the second and third optocoupler light sources equally when the 100 kΩ variable resistor is set to its midpoint and illuminates only one light source when the 100 kΩ variable resistor is set to an endpoint value. Thus, the 100 kΩ variable resistor can be utilized by the user to adjust the ratio of the unbuffered signal and the voltage-buffered signal.

Second Interconnect System with Internal Mixer

Figure 4:
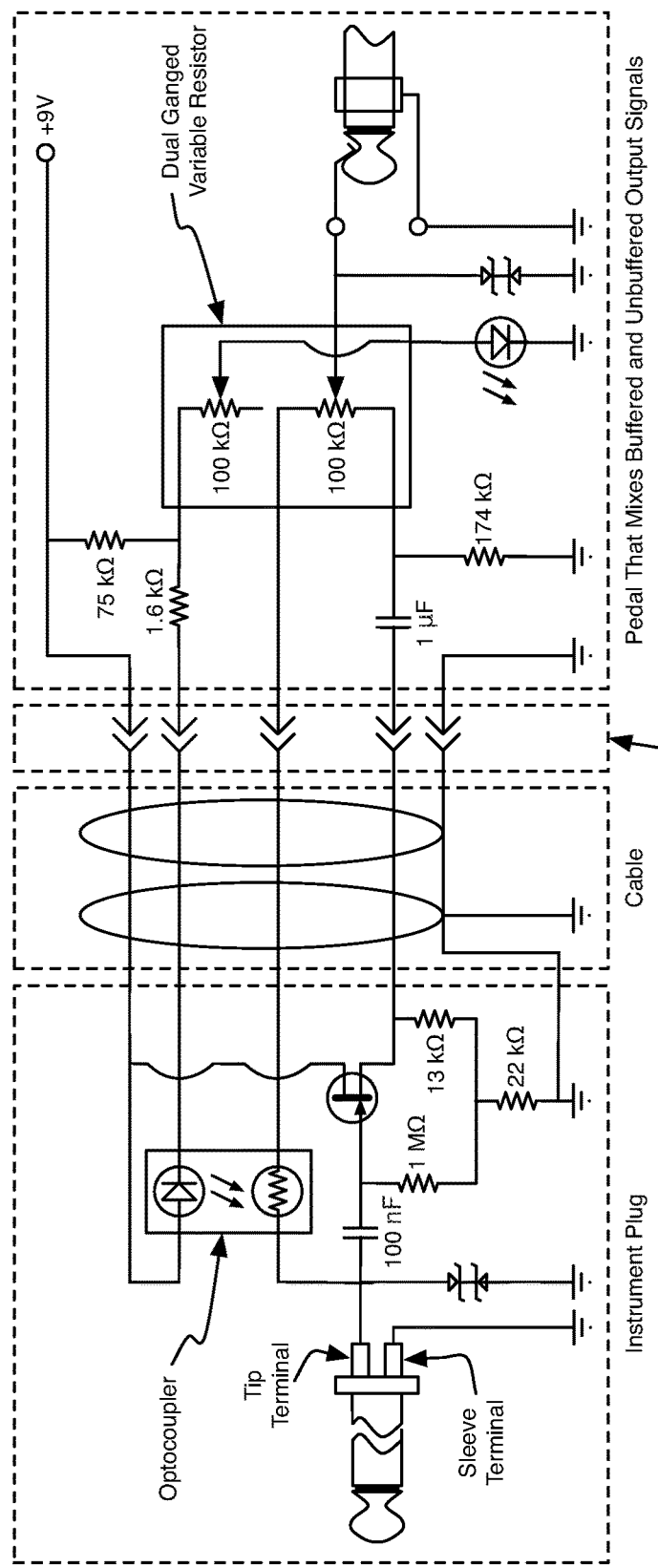
FIG. 4 is a diagram of a second instrument interconnect system that allows a musician to mix a voltage-buffered output signal and an unbuffered output signal.

Another embodiment of an interconnect system that enables a musician to mix a voltage-buffered signal with a unbuffered signal is shown in FIG. 4. The instrument plug, cable, and connector of FIG. 4 are identical to the instrument plug, cable, and connector of FIG. 3. However, as will be discussed below, (a) the isolation of the unbuffered signal from the tip terminal of the ¼ inch plug, (b) the isolation of the unbuffered signal from the tip terminal of the ¼ inch diameter jack, and (c) the mixing of the unbuffered signal and the voltage-buffered signal are performed by a dual-ganged variable resistor and not by the second and third optocouplers of FIG. 3.

As shown in FIG. 4, the first terminal of the interconnect system's connector is coupled to a 9-volt power supply and the first terminal of a 75 kΩ resistor.

The second terminal of the interconnect system's connector is coupled to the first terminal of a 1.6 kΩ resistor. The second terminal of the 1.6 kΩ resistor is coupled to the second terminal of the 75 kΩ resistor and the first terminal of the first gang of a 100 kΩ variable resistor.

The third terminal of the interconnect system's connector is coupled to the first terminal of the second gang of the 100 kΩ variable resistor.

The fourth terminal of the interconnect system's connector is coupled to the first terminal of a 1 µF capacitor. The second terminal of the 1 µF capacitor is coupled to the second terminal of the second gang of the 100 kΩ variable resistor and to the first terminal of a 174 kΩ resistor. The second terminal of the 174 kΩ resistor is coupled to ground.

The fifth terminal of the interconnect system's connector is coupled to ground.

The third (wiper) terminal of the first gang of the 100 kΩ variable resistor is coupled to the first terminal of a diode, such as a light emitting diode, i.e., a LED. As shown in FIG. 4, the second terminal of the LED is coupled to ground. If the diode is an LED, then the LED can display the relative percentage of the unbuffered signal. Thus, when a fully unbuffered signal is selected, then the LED would be fully on. On the other hand, when a fully voltage-buffered signal is selected, then the LED would be off. If a mixture of an unbuffered signal and a voltage-buffered signal is selected, then the LED would emit an amount of light between fully on and off.

The third (wiper) terminal of the second gang of the 100 kΩ variable resistor is coupled to the first terminal of a second voltage suppressor and the tip terminal of the ¼ inch output jack. The second terminal of the second voltage suppressor is coupled to ground.

The ground terminal of the ¼ inch output jack is coupled to ground.

As is shown in FIG. 4, the isolation of the unbuffered signal from the tip terminal of the ¼ inch plug is controlled by the first gang of the 100 kΩ variable resistor. In addition, the proportions of the unbuffered signal and the voltage-buffered signal that are present in the signal output by the tip terminal of the ¼ inch output jack are controlled by the second gang of the 100 kΩ variable resistor.

In some embodiments of the invention (not shown), an amplifier is placed between the wiper of the second gang of the variable resistor and the first terminal of the second voltage suppressor and tip terminal of the ¼ inch output jack. In still other embodiments of the invention, an analog-to-digital converter is utilized to convert the analog output signal to a digital format so that audio can be provided to audio-receiving devices in digital format.

Interconnect System with Gain Control

Figure 5:
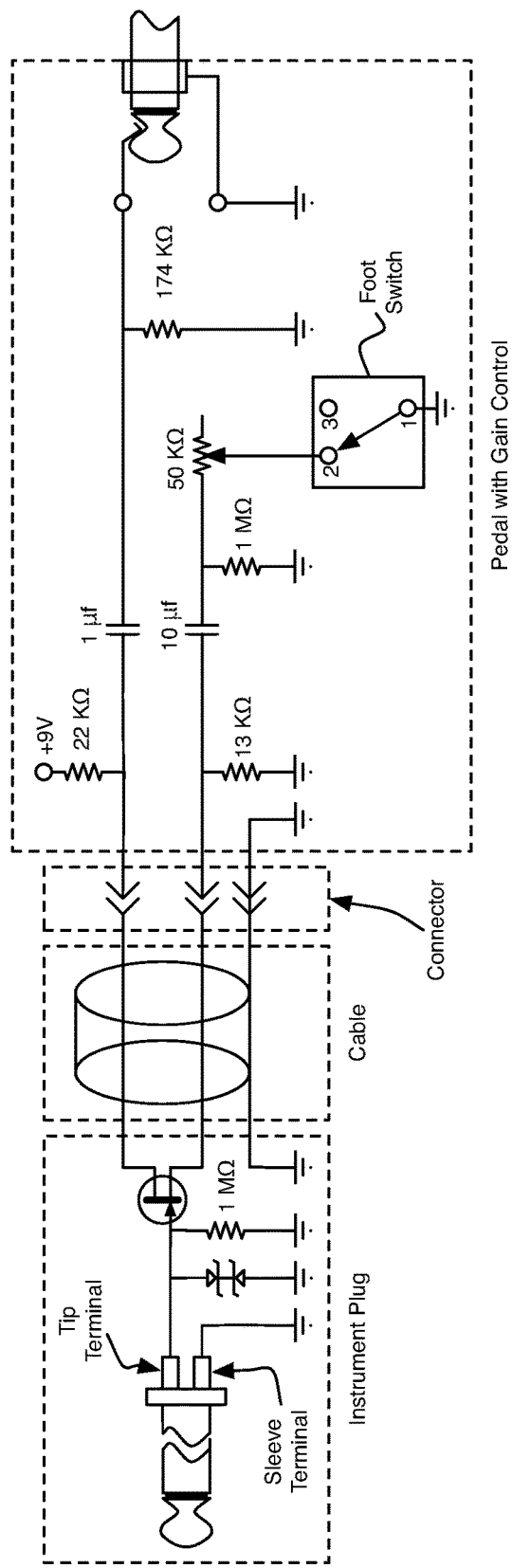
FIG. 5 is a diagram of a voltage-buffered instrument interconnect system that includes a gain control.

Another embodiment of the invention is the interconnect system shown in FIG. 5. This interconnect system allows a musician to control the gain of the interconnect system while the musician is playing his instrument. For example, the musician could control the gain of the interconnect system by rotating a pedal pad with the musician's foot. This rotation would cause the resistance of a variable resistor to change. The musician could also quickly switch between two different gains by depressing a foot switch, which would activate or deactivate the gain-adjust circuit of the interconnect system.

As shown in FIG. 5, the interconnect system includes an instrument plug. The instrument plug includes a conventional ¼ inch diameter plug with a tip, a sleeve, a tip terminal, a sleeve terminal, and a housing. The instrument plug is intended to be inserted into the well-known conventional ¼ inch instrument jack of an instrument, such as a guitar or a bass. The instrument plug's tip receives the output signal from the instrument. Similarly, the instrument plug's sleeve is coupled to the instrument's ground.

The instrument plug of FIG. 5 includes a voltage suppressor. The first terminal of the voltage suppressor is coupled to the tip terminal. The second terminal of the voltage suppressor is coupled to ground. The purpose of the voltage suppressor is to protect the preamplifier from damage due to static electricity that may be present near the instrument.

The instrument plug of FIG. 5 also includes a preamplifier circuit. The preamplifier circuit includes a 1 MΩ resistor and a N-channel FET. As shown in FIG. 5, the gate of the N-channel FET is coupled to the tip terminal, the first terminal of the voltage suppressor, and the first terminal of the 1 MΩ resistor. The second terminal of the 1 MΩ resistor is coupled to ground. The tip terminal, the sleeve terminal, the voltage suppressor, the 1 MΩ resistor, and the N-channel FET are all located within the conventional housing (not shown) of the ¼ inch diameter plug.

As shown in FIG. 5, the interconnect system also includes a cable. The cable, which is flexible and has a length of approximately 25 feet, includes two signal conductors as well as a ground shield. Other embodiments of the invention have a flexible cable with a length of 3, 6, 9, 10, 12, or 20 feet. The first conductor of the cable is coupled to the drain of the N-channel FET. The second conductor of the cable is coupled to the source of the N-channel FET. The ground shield of the cable is coupled to ground.

As shown in FIG. 5, the interconnect system also includes a three-conductor connector, such as a three pin XLR connector. The first two conductors of the connector are coupled to the first two conductors of the cable, respectively. The third conductor of the connector is coupled to the ground shield of the cable.

As shown in FIG. 5, the interconnect system also includes a pedal. The pedal may be a foot pedal that can be operated by a musician while the musician is playing an instrument. The pedal allows the musician to select via a foot switch whether a gain-adjust circuit is activated or is deactivated. When the gain-adjust circuit is active, the pedal also allows the musician to adjust the gain of the interconnect system by changing the resistance of a variable resistor.

As shown in FIG. 5, the pedal is coupled to the three-conductor connector. The first conductor of the connector is coupled to the second terminal of a 22 kΩ resistor. The first terminal of the 22 kΩ resistor is coupled to a 9-volt power supply, such as a 9-volt battery or an external power supply. The second terminal of the 22 kΩ resistor is also coupled to the first terminal of a 1 µF capacitor. The second terminal of the 1 µF capacitor is coupled to the first terminal of a 174 kΩ resistor. The second terminal of the 174 kΩ resistor is coupled to ground. The first terminal of the 174 kΩ resistor is also coupled to the tip terminal of a conventional ¼ inch output jack. The sleeve terminal of the output jack is coupled to ground.

As shown in FIG. 5, the second conductor of the connector is coupled to the first terminal of a 13 kΩ resistor. The second terminal of the 13 kΩ resistor is coupled to ground. The first terminal of the 13 kΩ resistor is also coupled to the first terminal of a 10 µF capacitor. The second terminal of the 10 µF capacitor is coupled to the first terminal of a 1 MΩ resistor. The second terminal of the 1 MΩ resistor is coupled to ground. The first terminal of the 1 MΩ resistor is also coupled to the first terminal of a variable 50 kΩ resistor. The wiper of the variable 50 kΩ resistor is coupled to the second terminal of a single-pole-double-throw (SPDT) switch. The first terminal of the SPDT switch is coupled to ground.

Finally, the third conductor of the connector is coupled to ground.

Interconnect System with Gain Control and Equalization

Figure 6:
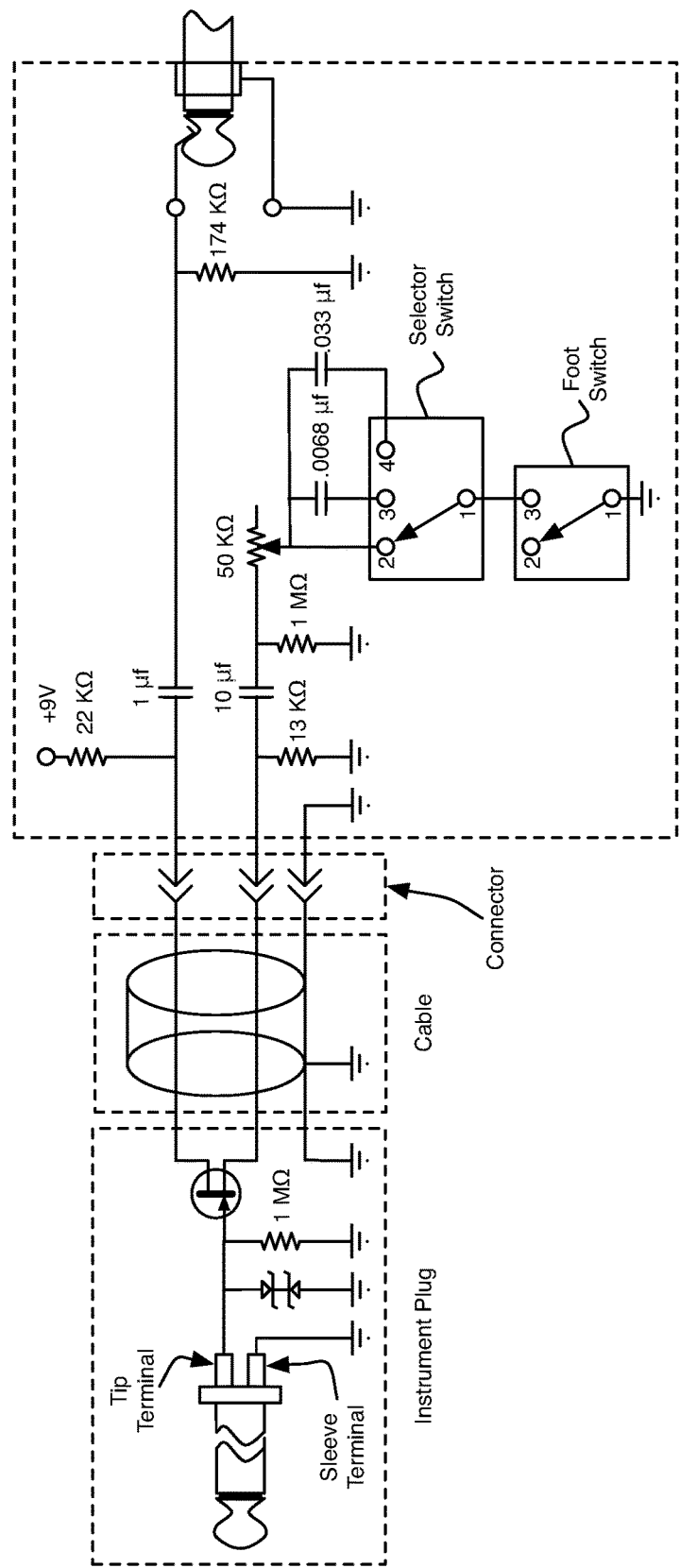
FIG. 6 is a diagram of a voltage-buffered instrument interconnect system that includes a gain control and an equalization control.

Another embodiment of the invention is the interconnect system shown in FIG. 6. Just as in the interconnect system of FIG. 5, this interconnect system allows a musician to control the gain of the interconnect system while the musician is playing his instrument. However, this embodiment also allows the musician to quickly select equalization circuits via a foot switch. For example, the musician could select a different turnover frequency.

As shown in FIG. 6, the interconnect system includes an instrument plug, a cable, and a connector. This instrument plug, cable and connector shown in FIG. 6 are identical to the previously-described instrument plug, cable and connector of FIG. 5.

As shown in FIG. 6, the interconnect system also includes a pedal. The pedal may be a foot pedal that can be operated by a musician while the musician is playing an instrument. The pedal allows the musician to select via a foot switch whether a gain/equalization-adjust circuit is activated or is deactivated. When the gain/equalization-adjust circuit is active, the pedal also allows the musician to adjust the gain and the equalization of the interconnect system. For example, the gain of the interconnect system can be adjusted by changing the resistance of a variable resistor. The equalization can be quickly adjusted by selecting equalization profiles.

As shown in FIG. 6, the pedal is coupled to the three-conductor connector. The first conductor of the connector is coupled to the second terminal of a 22 kΩ resistor. The first terminal of the 22 kΩ resistor is coupled to a 9-volt power supply, such as a 9-volt battery or an external power supply. The second terminal of the 22 kΩ resistor is also coupled to the first terminal of a 1 μF capacitor. The second terminal of the 1 μF capacitor is coupled to the first terminal of a 174 kΩ resistor. The second terminal of the 174 kΩ resistor is coupled to ground. The first terminal of the 174 kΩ resistor is also coupled to the tip terminal of a conventional ¼ inch output jack. The sleeve terminal of the output jack is coupled to ground.

As shown in FIG. 6, the second conductor of the connector is coupled to the first terminal of a 13 kΩ resistor. The second terminal of the 13 kΩ resistor is coupled to ground. The first terminal of the 13 kΩ resistor is also coupled to the first terminal of a 10 μF capacitor. The second terminal of the 10 μF capacitor is coupled to the first terminal of a 1 MΩ resistor. The second terminal of the 1 MΩ resistor is coupled to ground. The first terminal of the 1 MΩ resistor is also coupled to the first terminal of a variable 50 kΩ resistor. The wiper of the variable 50 kΩ resistor is coupled to the second terminal of a single-pole-triple-throw (SPTT) switch, the first terminal of a 0.0068 μF capacitor, and the first terminal of a 0.033 μF capacitor. The second terminal of the 0.0068 μF capacitor is coupled to the third terminal of the SPTT switch. The second terminal of the 0.033 μF capacitor is coupled to the fourth terminal of the SPTT switch. The first terminal of the SPTT switch is coupled to the third terminal of a SPDT switch. The first terminal of the SPDT switch is coupled to ground.

Finally, the third conductor of the connector is coupled to ground.

Other Interconnect Systems

Figure 7:
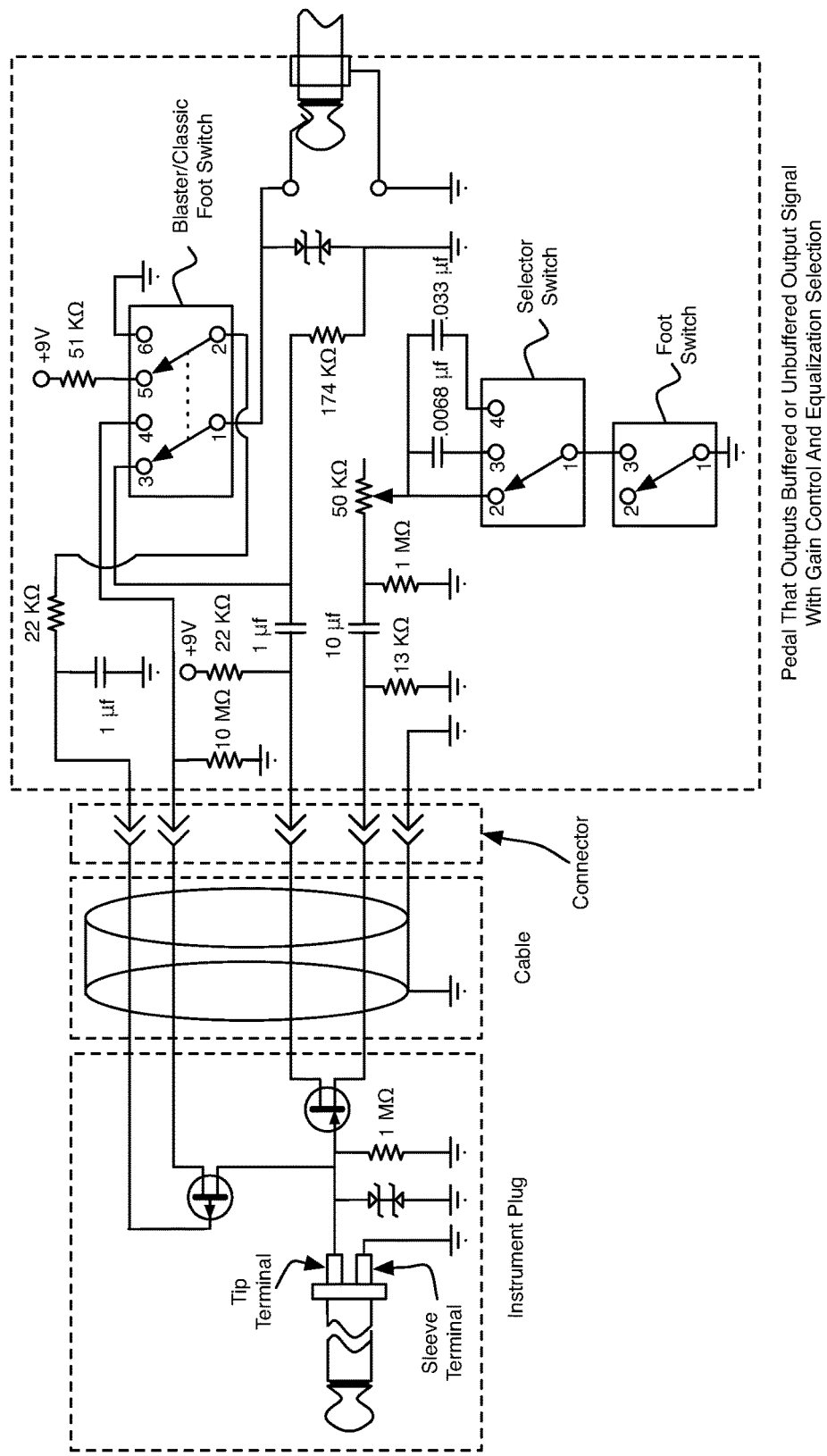
FIG. 7 is a diagram of an instrument interconnect system that allows a musician to select whether the system generates a voltage-buffered output signal or an unbuffered output signal and that includes a gain control and an equalization control.

Other embodiments of the interconnect system can be created by combining previously described embodiments. For example, an interconnect system that generates voltage-buffered or unbuffered output signals, allows a musician to control the gain of the interconnect system while the musician is playing his instrument, and allows a musician to control the frequency response of the interconnect system while the musician is playing his instrument is shown in FIG. 7. One of skill in the art, after reading the description of the previously discussed embodiments will fully understand the circuitry of the interconnect system shown in FIG. 7. For example, one of skill in the art would understand that a musician could de-activate both a gain-adjust circuit and an equalization circuit when the SPST switch is in a first position that couples the first and second terminals of the SPST. Similarly, one of skill in the art would understand that the musician could activate both a gain-adjust circuit and an equalization circuit when the SPST switch is in a second position that couples the first and third terminals of the SPST.

Definition of "Coupled"

Throughout this specification, the term "coupled" has been utilized. The term "coupled" is hereby defined to mean an electrical connection between two components that does not change the functionally of an electrical signal. For example, in FIG. 2 the tip terminal is "coupled" to the gate of the N-channel FET, but is not coupled to the source or the drain of the N-channel FET. Similarly, in FIG. 2 the drain of the N-channel FET is "coupled" to the first terminal of the 13 kΩ resistor, but is not "coupled" to the second terminal of the 13 kΩ resistor or to ground. Similarly, in FIG. 2, the first conductor of the cable is "coupled" to the first terminal of the 1 μF capacitor, but is not "coupled" to the second terminal of the 1 μF capacitor.

Definition of "Isolated"

Throughout this specification, the term "isolated" has been utilized. A first signal is hereby defined to be "isolated" from a second signal if the resistance between the first signal and the second signal is greater than 10 kΩ.

The invention claimed is:

1. An instrument interconnect system for coupling an instrument to an audio-receiving device, comprising:
   a. an instrument plug, the instrument plug including:
      i. a ¼ inch diameter plug with a tip terminal and a ground terminal, the ¼ inch diameter plug for receiving an instrument signal;
      ii. an unbuffered output that outputs a first signal based upon the instrument signal; and
      iii. a voltage-buffer having an input and a voltage-buffered output;
      wherein the voltage-buffered output outputs a second signal based upon the instrument signal;
   b. a flexible cable including:
      i. a first conductor coupled to the unbuffered output;
      ii. a second conductor coupled to the voltage-buffered output; and
      iii. a third conductor coupled to the ground terminal of the ¼ inch diameter plug;
      wherein the flexible cable has a first capacitance between the first conductor and the third conductor;
      wherein the flexible cable has a second capacitance between the second conductor and the third conductor;
      wherein the instrument signal is not voltage-buffered from the first capacitance of the flexible cable;
      wherein the instrument signal is voltage-buffered from the second capacitance of the flexible cable;
   c. a connector including:
      i. a first conductor coupled to the first conductor of the cable;
      ii. a second conductor coupled to the second conductor of the cable; and iii. a third conductor coupled to the third conductor of the cable;
d. a device including:
i. a first conductor coupled to the first conductor of the connector;
ii. a second conductor coupled to the second conductor of the connector; and
iii. a third conductor coupled to the third conductor of the connector;
iv. an audio output for coupling to an audio-receiving device and
v. a switch having a first position and a second position;
wherein the output jack outputs a signal based only on the first signal when the switch is in the first position;
wherein the output jack outputs a signal based only on the second signal when the switch is in the second position.

2. The instrument interconnect system of claim 1, wherein the device is a foot pedal.

3. The instrument interconnect system of claim 1, wherein the device includes a second switch having a first position and a second position, wherein the output jack outputs a signal with a first gain when the second switch is in the first position, and outputs a signal with a second gain when the second switch is in the second position, wherein the second gain is distinct from the first gain.

4. The instrument interconnect system of claim 1, wherein the device includes a second switch having a first position and a second position, wherein the output jack outputs a signal with a first equalization when the second switch is in the first position, and outputs a signal with a second equalization when the second switch is in the second position, wherein the second equalization is distinct from the first equalization.

5. An instrument interconnect system for coupling an instrument to an audio-receiving device, comprising:
a. an instrument plug, the instrument plug including:
i. a ¼ inch diameter plug with a tip terminal and a ground terminal, the ¼ inch diameter plug for receiving an instrument signal;
ii. an unbuffered output that outputs a first signal based upon the instrument signal; and
iii. a voltage-buffer having an input and a voltage-buffered output;
wherein the voltage-buffered output outputs a second signal based upon the instrument signal;
wherein the instrument plug simultaneously outputs the first signal and the second signal;
b. a flexible cable including:
i. a first conductor coupled to the unbuffered output;
ii. a second conductor coupled to the voltage-buffered output; and
iii. a third conductor coupled to the ground terminal of the ¼ inch diameter plug;
wherein the flexible cable has a first capacitance between the first conductor and the third conductor;
wherein the flexible cable has a second capacitance between the second conductor and the third conductor;
wherein the instrument signal is not voltage-buffered from the first capacitance of the flexible cable;
wherein the instrument signal is voltage-buffered from the second capacitance of the flexible cable;
c. a connector including:
i. a first conductor coupled to the first conductor of the cable;
ii. a second conductor coupled to the second conductor of the cable; and
iii. a third conductor coupled to the third conductor of the cable;
d. a device including:
i. a first conductor coupled to the first conductor of the connector;
ii. a second conductor coupled to the second conductor of the connector;
iii. a third conductor coupled to the third conductor of the connector; and
iv. an audio output for coupling to an audio-receiving device.

6. The instrument interconnect system of claim 5, wherein, at a first time, the output jack outputs a signal based only on the first signal; wherein, at a second time, the output jack outputs a signal based only on the second signal.

7. The instrument interconnect system of claim 5, wherein, at a first time, the output jack outputs a signal based only on the first signal; wherein, at a second time, the output jack outputs a signal based only on the second signal; wherein, at a third time, the output jack outputs a signal based on both the first signal and the second signal.

8. The instrument interconnect system of claim 5, wherein the device includes a variable resistor and the output jack outputs a signal based only on the unbuffered output when the variable resistor is set to a first value, wherein the output jack outputs a signal based on both the unbuffered output and the buffered output when the variable resistor is set to a second value, and the output jack outputs a signal based only on the buffered output when the variable resistor is set to a third value.

9. The instrument interconnect system of claim 8, wherein the unbuffered output is isolated from the tip terminal of the ¼ inch diameter plug when the variable resistor is set to the third value.

10. The instrument interconnect system of claim 9, wherein the unbuffered output is isolated from the tip terminal of the output jack when the variable resistor is set to the third value.

11. The instrument interconnect system of claim 5, wherein the device is a foot pedal.

12. The instrument interconnect system of claim 5, wherein the device includes a switch having a first position and a second position, wherein the output jack outputs a signal with a first gain when the switch is in the first position, and outputs a signal with a second gain when the switch is in the second position, wherein the second gain is distinct from the first gain.

13. The instrument interconnect system of claim 5, wherein the device includes a switch having a first position and a second position, wherein the output jack outputs a signal with a first equalization when the switch is in the first position, and outputs a signal with a second equalization when the switch is in the second position, wherein the second equalization is distinct from the first equalization.

14. An instrument interconnect system for coupling an instrument to an audio-receiving device, comprising:
a. an instrument plug, the instrument plug including:
i. a ¼ inch diameter plug with a tip terminal and a ground terminal, the ¼ inch diameter plug for receiving an instrument signal;
ii. an isolation circuit, the isolation circuit having an input for receiving a signal based upon the instrument signal, the isolation circuit having an output, which shall be referred to as "the unbuffered output", for controllably outputting a first signal, the isolation circuit having a control input for controlling the output of the first signal; and iii. a voltage-buffer having an input and a voltage-buffered output;

b. a flexible cable including:
i. a first conductor coupled to the unbuffered output;
ii. a second conductor coupled to the voltage-buffered output;
iii. a third conductor coupled to the ground terminal of the ¼ inch diameter plug; and
iv. a fourth conductor coupled to the control input of the isolation circuit;

c. a connector including:
i. a first conductor coupled to the first conductor of the cable;
ii. a second conductor coupled to the second conductor of the cable;
iii. a third conductor coupled to the third conductor of the cable; and
iv. a fourth conductor coupled to the fourth conductor of the cable;

d. a device including:
i. a first conductor coupled to the first conductor of the connector;
ii. a second conductor coupled to the second conductor of the connector; and
iii. a third conductor coupled to the third conductor of the connector;
iv. a control output coupled to the fourth conductor of the connector; and
v. an audio output for coupling to an audio-receiving device.

15. The instrument interconnection system of claim 14, wherein the isolation circuit is an optocoupler, the input to the isolation circuit is a first photocell terminal, the output of the isolation circuit is a second photocell terminal, and the control input of the isolation circuit is a light-source terminal.

16. The instrument interconnection system of claim 15, wherein the voltage-buffered output outputs a second signal based upon the instrument signal; wherein the instrument plug simultaneously outputs the first signal and the second signal.

17. The instrument interconnection system of claim 16, wherein the flexible cable has a first capacitance between the first conductor and the third conductor; wherein the flexible cable has a second capacitance between the second conductor and the third conductor; wherein the instrument signal is not voltage-buffered from the first capacitance of the flexible cable; wherein the instrument signal is voltage-buffered from the second capacitance of the flexible cable.

18. The instrument interconnect system of claim 17, wherein the device includes a variable resistor and the output jack outputs a signal based only on the unbuffered output when the variable resistor is set to a first value, wherein the output jack outputs a signal based on both the unbuffered output and the buffered output when the variable resistor is set to a second value, and the output jack outputs a signal based only on the buffered output when the variable resistor is set to a third value.

19. The instrument interconnect system of claim 18, wherein the unbuffered output is isolated from the tip terminal of the ¼ inch diameter plug when the variable resistor is set to the third value.

20. The instrument interconnect system of claim 19, wherein the unbuffered output is isolated from the tip terminal of the output jack when the variable resistor is set to the third value.

* * * * *